United States Patent
Numagi et al.

(10) Patent No.: US 10,306,761 B2
(45) Date of Patent: May 28, 2019

(54) PRINTED WIRING BOARD, PRINTED CIRCUIT BOARD, AND ELECTRONIC APPARATUS

(71) Applicant: CANON KABUSHIKI KAISHA, Tokyo (JP)

(72) Inventors: Takashi Numagi, Hachioji (JP); Youhei Tazawa, Yokohama (JP); Shoji Matsumoto, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/825,563

(22) Filed: Nov. 29, 2017

(65) Prior Publication Data

US 2018/0168039 A1 Jun. 14, 2018

(30) Foreign Application Priority Data

Dec. 13, 2016 (JP) ................. 2016-241103

(51) Int. Cl.
*H05K 1/18* (2006.01)
*H05K 1/11* (2006.01)
*H01L 23/48* (2006.01)
*H05K 1/02* (2006.01)

(52) U.S. Cl.
CPC ............ *H05K 1/115* (2013.01); *H01L 23/48* (2013.01); *H05K 1/0218* (2013.01); *H01L 2224/16225* (2013.01); *H05K 1/0216* (2013.01); *H05K 2201/09318* (2013.01); *H05K 2201/09609* (2013.01); *H05K 2201/09627* (2013.01)

(58) Field of Classification Search
CPC .......... H01L 2224/16225; H01L 23/48; H05K 1/0216; H05K 1/0218; H05K 1/115; H05K 2201/09318; H05K 2201/09609; H05K 2201/09627
See application file for complete search history.

(56) References Cited

U.S. PATENT DOCUMENTS

| | | |
|---|---|---|
| 5,101,252 A | 3/1992 | Matsumoto |
| 7,081,672 B1 * | 7/2006 | Govind ............ H01L 23/49827 257/724 |
| 7,355,864 B2 | 4/2008 | Matsumoto |
| 7,564,695 B2 | 7/2009 | Matsumoto |
| 7,577,004 B2 | 8/2009 | Matsumoto |
| 7,595,546 B2 | 9/2009 | Matsumoto |

(Continued)

FOREIGN PATENT DOCUMENTS

WO 2013/111194 A1 5/2015

*Primary Examiner* — Yuriy Semenenko
(74) *Attorney, Agent, or Firm* — Venable LLP

(57) ABSTRACT

Provided is a printed wiring board including: a plurality of inner layers including a ground layer and a power supply layer; and a plurality of ground vias and a plurality of power supply vias each provided to penetrate at least the ground layer and the power supply layer in a thickness direction of the printed wiring board, a ground potential being applied to the plurality of ground vias at the ground layer, and a power supply potential being applied to the plurality of power supply vias at the power supply layer. In a top view from a direction perpendicular to the printed wiring board, a distance between vias to which the same potential is applied is shorter than a distance between vias to which different potentials are applied.

13 Claims, 10 Drawing Sheets

(56) References Cited

U.S. PATENT DOCUMENTS

| | | |
|---|---|---|
| 8,428,155 B2 | 4/2013 | Matsumoto |
| 9,030,021 B2* | 5/2015 | Song .................. H01L 23/49827 |
| | | 257/737 |
| 9,192,044 B2 | 11/2015 | Hayashi et al. |
| 9,379,079 B1* | 6/2016 | Fang ................... H01L 23/5283 |
| 9,549,459 B2 | 1/2017 | Ito et al. |
| 2002/0116368 A1 | 8/2002 | Matsumoto |
| 2002/0159243 A1* | 10/2002 | Ogawa .............. H01L 23/49822 |
| | | 361/760 |
| 2007/0245556 A1* | 10/2007 | Hosomi ................ H01L 23/481 |
| | | 29/852 |
| 2009/0283904 A1* | 11/2009 | Ali ...................... H01L 23/5286 |
| | | 257/737 |
| 2012/0043371 A1* | 2/2012 | Hayashi ............... B23K 1/0016 |
| | | 228/208 |
| 2014/0334121 A1* | 11/2014 | Ito ........................ H05K 1/0243 |
| | | 361/767 |
| 2015/0319845 A1 | 11/2015 | Numagi et al. |
| 2016/0353569 A1* | 12/2016 | Furuichi ........... H01L 23/49822 |

\* cited by examiner

PRINTED WIRING BOARD, PRINTED CIRCUIT BOARD, AND ELECTRONIC APPARATUS

BACKGROUND OF THE INVENTION

Field of the Invention

The present invention relates to a printed wiring board, a printed circuit board, and an electronic apparatus.

Description of the Related Art

As electronic apparatus achieves higher functionality and higher performance, the data transfer speed between semiconductor devices mounted on the printed wiring board has increased. Higher data transfer speed results in a greater variation in the propagation times of the electric signals due to various noises. This variation in the propagation time is called jitter. In the clock synchronous type interface, as the jitter increases, the timing margin decreases, so that a malfunction tends to occur. An example of an electronic apparatus that uses such a clock synchronous interface includes a Double-Data-Rate4 Synchronous Dynamic Random Access Memory.

One of the causes of jitter is power supply noise. As an example of jitter caused by power supply noise, there is simultaneous switching noise jitter (hereinafter abbreviated as SSN jitter) generated by power supply noise that is generated when a plurality of buffer circuits of a semiconductor device operate simultaneously. When the logic levels of the signals output from the signal terminals of the plurality of buffer circuits of the semiconductor device are switched at the same time, a switching current is generated. The capacitors, printed wiring boards, and package boards which are the power supply path to the semiconductor device have parasitic inductance. When the switching current flows in the parasitic inductance, a counter electromotive force is generated, and this counter electromotive force becomes power supply noise. The power supply noise changes the drive voltage of the buffer circuit, and the output timing of the signal from the buffer circuit fluctuates. In this way, SSN jitter occurs.

Therefore, in order to reduce the SSN jitter, it is effective to reduce the inductance of the power supply wiring. As a method of reducing the inductance, it has been suggested to provide a capacitor between the power supply via and the ground via, and the power supply via and the ground via are arranged close to each other (see International Publication No. 2013/111194).

Furthermore, in order to reduce the inductance, it is necessary to increase the numbers of power supply vias, ground vias and the like. However, when the occupied area is increased by increasing the numbers of power supply vias, ground vias and the like, a parasitic inductance is generated by an increase in the wiring, so that there is a limitation on the reduction of the inductance by such method. Therefore, a structure of power supply wiring that reduces the inductance without increasing the occupied area is desired.

SUMMARY OF THE INVENTION

Therefore, it is an object of the present invention to provide a printed wiring board, a printed circuit board, and an electronic apparatus having a power supply wiring structure of which occupied area is small and which has a small inductance.

A printed wiring board according to one aspect of the present invention including: a plurality of inner layers including a ground layer and a power supply layer; and a plurality of ground vias and a plurality of power supply vias each provided to penetrate at least the ground layer and the power supply layer in a thickness direction of the printed wiring board, a ground potential being applied to the plurality of ground vias at the ground layer, and a power supply potential being applied to the plurality of power supply vias at the power supply layer. In a top view from a direction perpendicular to the printed wiring board, a distance between vias to which the same potential is applied is shorter than a distance between vias to which different potentials are applied.

A printed circuit board according to one aspect of the present invention including: a printed wiring board including: a plurality of inner layers including a ground layer and a power supply layer; and a plurality of ground vias and a plurality of power supply vias each provided to penetrate at least the ground layer and the power supply layer in a thickness direction of the printed wiring board, a ground potential being applied to the plurality of ground vias at the ground layer, and a power supply potential being applied to the plurality of power supply vias at the power supply layer, in which, a top view from a direction perpendicular to the printed wiring board, a distance between vias to which the same potential is applied is shorter than a distance between vias to which different potentials are applied; and a semiconductor device which has a ground terminal electrically connected to the ground layer of the printed wiring board and a power supply terminal electrically connected to the power supply layer of the printed wiring board, and which is mounted on a first mounting surface of the printed wiring board.

Further features of the present invention will become apparent from the following description of exemplary embodiments with reference to the attached drawings.

DESCRIPTION OF THE EMBODIMENTS

Figure 1:
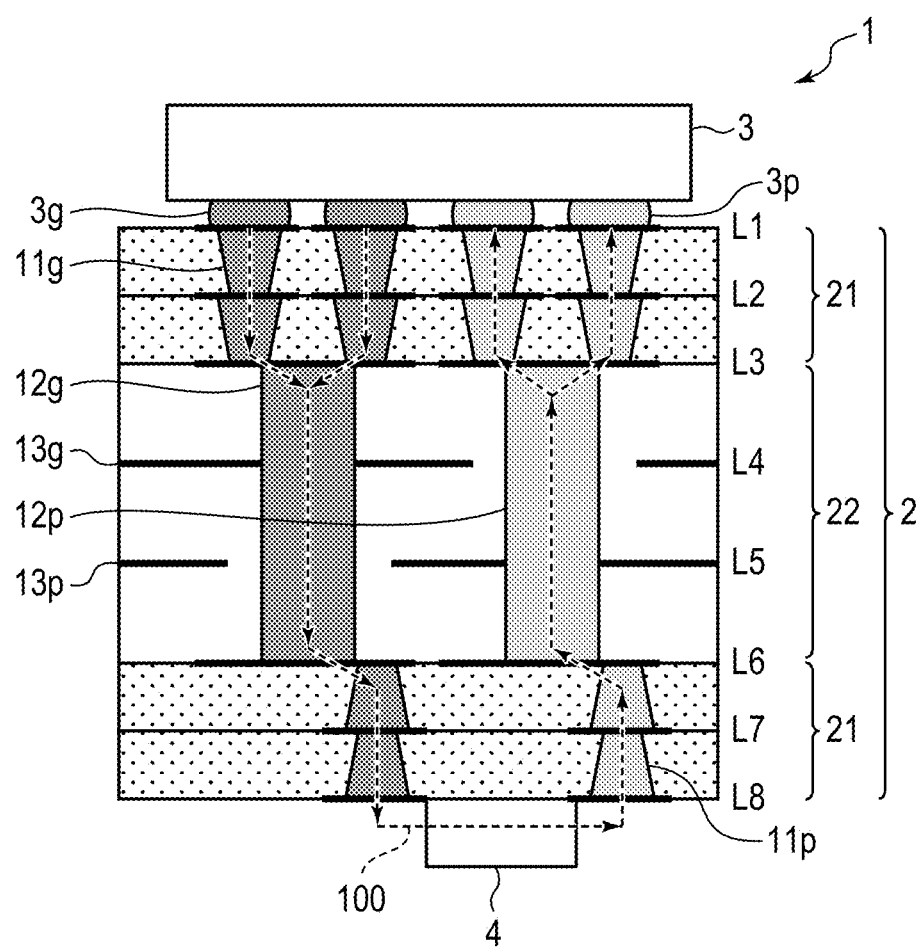
FIG. 1 is a cross-sectional view illustrating a printed circuit board according to a first embodiment.

Preferred embodiments of the present invention will now be described in detail in accordance with the accompanying drawings. Elements common to a plurality of drawings are denoted by the same reference numerals, and descriptions thereof may be omitted or simplified in some cases.

First Embodiment

FIG. 1 is a cross sectional view illustrating a printed circuit board 1 according to a first embodiment. As illustrated in FIG. 1, the printed circuit board 1 includes a printed wiring board 2, a semiconductor device 3, and a capacitor 4 serving as a bypass device. The semiconductor device 3 includes a power supply terminal 3p, a ground terminal 3g, and a signal terminal (not shown). Each terminal of the semiconductor device 3 has a structure of Ball Grid Array (BGA), and the semiconductor device 3 can be mounted on the printed wiring board 2 by soldering. The capacitor 4 is a surface mount device having two external electrode terminals capable of being surface-mounted, and can be mounted on the printed wiring board 2 by soldering.

The printed wiring board 2 is a build-up wiring board with a core layer 22 and build-up layers 21 formed on both sides of the core layer 22. Each build-up layer 21 has a power supply build-up via 11p and a ground build-up via 11g. The core layer 22 includes a power supply core via 12p, a ground core via 12g, a power supply plane 13p, and a ground plane 13g. The power supply core via 12p and the ground core via 12g are core vias provided to penetrate the core layer 22 including the power supply plane 13p and the ground plane 13g in the thickness direction. The printed wiring board 2 has a total of 8 layers of wiring layers including a ground layer and a power supply layer in the inner layer. Each wiring layer is formed, for example, of a copper foil patterned in a predetermined shape or the like. As shown in FIG. 1, the first to eighth layers are referred to as a wiring layer L1 to a wiring layer L8, respectively. The wiring layer L4 is a ground layer provided with a ground plane 13g to which the ground potential is applied, and the wiring layer L5 is a power supply layer provided with a power supply plane 13p to which a power supply potential is applied. Two wiring layers L1 and L8 of the wiring layers provided on surfaces of the printed wiring board 2 are referred to as surface layers and the other six wiring layers L2 to L7 are referred to as inner layers.

The semiconductor device 3 is mounted on the first mounting surface (i.e., the wiring layer L1) which is one of the surfaces of the printed wiring board 2. The capacitor 4 is mounted on the second mounting surface (i.e., the wiring layer L8), which is the other of the surfaces of the printed wiring board 2.

The power supply build-up via 11p and the ground build-up via 11g provided on the printed wiring board 2 have a pad-on via structure with pads provided on the via. The power supply terminal 3p of the semiconductor device 3 is connected to one of the terminals (first terminal) of the capacitor 4 through the power supply build-up via 11p and the power supply core via 12p of the printed wiring board 2. More specifically, the power supply terminal 3p of the semiconductor device 3 and one of the terminals of the capacitor 4 are electrically connected to the power supply layer.

The ground terminal 3g of the semiconductor device is connected to the other of the terminals (second terminal) of the capacitor 4 via the ground build-up via 11g and the ground core via 12g of the printed wiring board 2. More specifically, the ground terminal 3g of the semiconductor device 3 and the other of the terminals of the capacitor 4 are electrically connected to the ground layer. A current is supplied to the semiconductor device 3 via the power supply path 100.

Figure 2A:
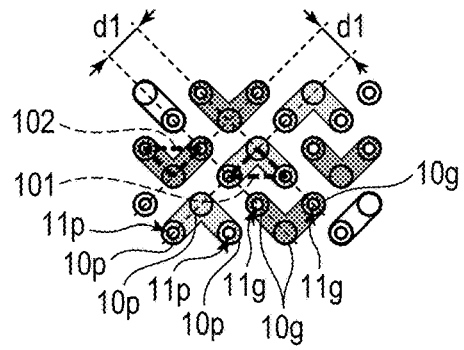
FIG. 2A, FIG. 2B, FIG. 2C, FIG. 2D, and FIG. 2E are plan views of a wiring layer constituting a printed circuit board according to the first embodiment.

FIG. 2A to FIG. 2E are plan views, as seen from a direction perpendicular to the printed wiring board 2 of the wiring layer constituting the printed wiring board 2 according to the first embodiment. Some of the wirings and the vias of each layer are shown in FIG. 2A to FIG. 2E. FIG. 2A is a plan view illustrating the wiring layer L1 of the printed wiring board 2. In the wiring layer L1 of the printed wiring board 2, a surface layer power supply pad 10p and a surface layer ground pad 10g to which each terminal of the semiconductor device 3 is connected are arranged in a square lattice pattern. The diameter of the surface layer power supply pad 10p and the surface layer ground pad 10g is 0.3 mm, and the center-to-center distance is 0.5 mm (d1 in FIG. 2A). Three surface layer power supply pads 10p connected by the power supply wiring are placed at the vertexes of a triangle 101. At the position of the two surface layer power supply pads 10p arranged at both ends of the bottom side of the triangle 101 (the lower side in FIG. 2A), the power supply build-up vias 11p are arranged so that its center matches the center of the surface layer power supply pad 10p (hereinafter such arrangement will be referred to as "pad-on"). The hole diameter of the power supply build-up via 11p is 0.15 mm.

The layout of the surface layer ground pads 10g and the ground build-up vias 11g are symmetrical in the vertical direction with respect to the surface layer power supply pads 10p and the power supply build-up vias 11p. The three surface layer ground pads 10g connected by the ground wiring are arranged at the vertex of an inverted triangle 102. The ground build-up vias 11g are placed as pad-on at the positions of two surface layer ground pads 10g arranged at both ends of the bottom side of the inverted triangle 102 (the upper side in FIG. 2A). The hole diameter of the ground build-up via 11g is also 0.15 mm.

In this way, in the wiring layer L1, the triangle 101 corresponding to the surface layer power supply pads 10p and the inverted triangle 102 corresponding to the surface layer ground pads 10g are repeatedly arranged. However, if the printed wiring board 2 has a structure that can stack (overlap) the build-up via on the core via, the power supply build-up via 11p may be arranged as pad-on for each of the three surface layer power supply pads 10p. Likewise, the ground build-up via 11g may be arranged as pad-on for each of the three surface layer ground pads 10g.

Figure 2B:
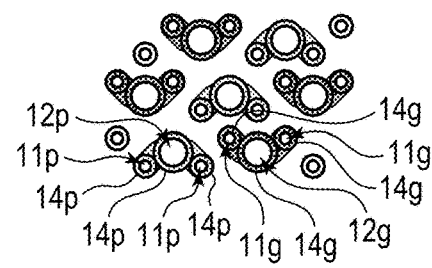

FIG. 2B is a plan view illustrating a wiring layer L3 of the printed wiring board 2. The ground build-up vias 11g and the power supply build-up vias 11p shown in FIG. 2B are build-up vias connecting a wiring layer L2 and a wiring layer L3. The ground core vias 12g and the power supply core vias 12p shown in FIG. 2B are core vias connecting the wiring layer L3 to a wiring layer L6. One power supply core via 12p is arranged closely to two power supply build-up vias 11p and connected with a power supply wiring. As shown in FIG. 2B, the inner layer power supply pad 14p of the power supply build-up via 11p and the inner layer power supply pad 14p of the power supply core via 12p are preferably circumscribed. This is because the wiring length connecting the inner layer power supply pads 14p can be shortened, and the inductance can be reduced.

Likewise, one ground core via 12g is arranged close to two ground build-up vias 11g, and is connected with a ground wiring. Like the inner layer power supply pad 14p, the inner layer ground pad 14g of the ground build-up via 11g and the inner layer ground pad 14g of the ground core via 12g are preferably circumscribed.

In the first embodiment, the diameter of the inner layer power supply pad 14p of the power supply build-up via 11p and the diameter of the inner layer ground pad 14g of the ground build-up via 11g are both 0.275 mm. The hole diameter of the power supply core via 12p and the ground core via 12g are both 0.3 mm. Any of the diameters of the external peripheral side of the power supply pad 14p of the L3 layer and the L6 layer of the power supply core via 12p and the ground pad 14g of the L3 layer and the L6 layer of the ground core via 12g is 0.5 mm. Both of the diameters of the external peripheral sides of the power supply pad 14p of the L4 layer and the L5 layer of the power supply core via 12p and the ground pad 14g of the L4 layer and the L5 layer of the ground core via 12g are 0.65 mm. More specifically, the diameter of the pad of the core via is 0.5 mm in the L3 layer and the L6 layer, and is 0.65 mm in the L4 layer and the L5 layer. The pad diameter is different between the L3 layer and the L6 layer and the L4 layer and the L5 layer, and it is possible to absorb the positional deviation of the via and the pad due to the alignment error of the layers at the time of manufacturing.

Figure 2C:
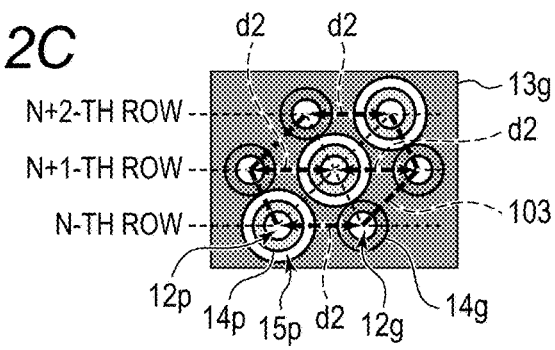

FIG. 2C is a plan view illustrating the wiring layer L4 of the printed wiring board 2, i.e., the ground layer. As shown in FIG. 2C, in the ground layer, a plurality of power supply core vias 12p and a plurality of ground core vias 12g are arranged in a triangular lattice. This triangular lattice has an arrangement including, as a unit, a first scalene triangle having two ground core vias 12g and one power supply core via 12p arranged at the vertices of the first scalene triangle, and a second scalene triangle having one ground core via 12g and two power supply core vias 12p arranged at the vertices of the second scalene triangle. Since the first scalene triangle and the second scalene triangle are congruent, as shown in FIG. 2C, multiple power supply core vias 12p and multiple ground core vias 12g form parallel hexagon having two first scalene triangles and four second scalene triangles as a unit. In the present specification, the "scalene triangle" refers to a triangle in which the lengths of all three sides are different. The "parallel hexagon" refers to a figure which is a hexagon in which three opposing pairs of opposite sides are parallel to each other and is not an equilateral hexagon.

The arrangement of the core vias will be described in more details. FIG. 2C illustrates the power supply core vias 12p and the ground core vias 12g arranged in multiple rows, and more particularly, illustrates the arrangement of the n-th row which is the first line, the (n+1)-th row which is the second line, and the (n+2)-th row which is the third line. Two power supply core vias 12p and four ground core vias 12g are arranged at the vertexes of a parallel hexagon 103. One power supply core via 12p is arranged at the center of the parallel hexagon 103. The center is the intersection of the diagonals of the parallel hexagon 103.

The arrangement of the power supply core vias 12p and the ground core vias 12g will be described in detail with reference to FIG. 2C. In the n-th row, from the left-hand side, the power supply core via 12p (first power supply via) and the ground core via 12g (first ground via) are arranged in order at the vertexes of the parallel hexagon 103. In the (n+1)-th row, from the left-hand side, the ground core via 12g (second ground via), the power supply core via 12p (second power supply via), and the ground core via 12g (third ground via) are arranged in order. In this case, two ground core vias 12g are arranged at the vertexes of the parallel hexagon 103, and the power supply core via 12p is enclosed in the parallel hexagon 103, and is arranged at the center of the parallel hexagon 103. In the (n+2)-th row, from the left-hand side, the ground core via 12g (fourth ground via) and the power supply core via 12p (third power supply via) are arranged in order. In each row, the center-to-center distance d2 between the core vias arranged in the horizontal direction is constant.

The relationship of the side lengths of the scalene triangle will be described. For example, the first ground via, the second power supply via, the third ground via form a first scalene triangle. Let a be the distance between the first ground via and the second power supply via. Let b (=d2) be the distance between the second power supply via and the third ground via. Let c be the distance between the third ground via and the first ground via. At this occasion, the relationship of c>b>a holds. In other words, the ground core vias 12g are arranged at the vertexes of both ends of the longest side (length c) of the first scalene triangle. In two sides (lengths a, b) other than the longest side, a ground core via 12g is arranged at one vertex and a power supply core via 12p is arranged at the other vertex.

For example, the first power supply via, the second ground via, and the second power supply via form a second scalene triangle. At this occasion, the distance between the first power supply via and the second ground via is a. The distance between the second ground via and the second power supply via is b (=d2). The distance between the second power supply via and the first power supply via is c. Similarly, the relationship of c>b>a holds, and the power supply core vias 12p are arranged at the vertexes of both ends of the longest side (length c) of the second scalene triangle. In two sides (lengths a and b) other than the longest side, a ground core via 12g is arranged at one vertex and a power supply core via 12p is arranged at the other vertex. The reason for making the relationship of the side lengths like this will be described later.

The inner layer ground pad 14g of the ground core via 12g in the n-th row and the inner layer power supply clearance 15p of the power supply core via 12p in the (n+1)-th row are preferably circumscribed. Further, the inner layer power supply clearance 15p of the power supply core via 12p in the (n+1)-th row and the inner layer ground pad 14g of the ground core via 12g in the (n+2)-th row are also arranged closer to each other. The inner layer ground pad 14g of the ground core via 12g in the n-th row and the inner layer power supply clearance 15p of the power supply core via 12p in the (n+1)-th row are preferably circumscribed. This is because the ground core via 12g in the n-th row and the power supply core via 12p in the (n+1)-th row can be brought closest to each other while necessary clearance is ensured, and the effect of reducing the inductance described below can be enhanced. Because of similar reasons, the inner layer power supply clearance 15p of the power supply core via 12p in the (n+1)-th row and the inner layer ground pad 14g of the ground core via 12g in the (n+2)-th row are preferably circumscribed. The inner layer power supply clearance 15p of the power supply core via 12p in the n-th row and the inner layer ground pad 14g of the left-hand side ground core via 12g in the (n+1)-th row are preferably circumscribed. Further, the inner layer power supply clearance 15p of the power supply core via 12p in the (n+2)-th row and the inner layer ground pad 14g of the right-hand side ground core via 12g in the (n+1)-th row are preferably circumscribed.

The inner layer power supply clearance 15p is an annular gap for preventing short circuit between the inner layer power supply pad 14p and the ground plane 13g. For this reason, the diameter of the external peripheral side of the inner layer power supply clearance 15p is larger than the diameter of the external peripheral side of the inner layer power supply pad 14p.

In the first embodiment, the center-to-center distance d2 between the core vias arranged in the horizontal direction is 1.06 mm. The diameter of the external peripheral side of the inner layer power supply pad 14p and the inner layer ground pad 14g is 0.65 mm. The width of the inner layer power supply clearance 15p is 0.125 mm.

Figure 2D:
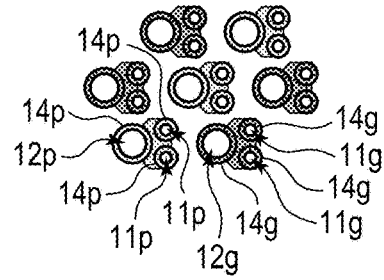

FIG. 2D is a plan view illustrating the wiring layer L6 of the printed wiring board 2. The ground build-up via 11g and the power supply build-up via 11p shown in FIG. 2D are build-up vias connecting the wiring layer L6 and the wiring layer L7. The ground core via 12g and the power supply core via 12p shown in FIG. 2D are core vias connecting the wiring layer L3 to the wiring layer L6. Two power supply build-up vias 11p are placed close to the power supply core via 12p. The inner layer power supply pad 14p of the power supply core via 12p and the inner layer power supply pad 14p of the power supply build-up via 11p are preferably circumscribed. This is to reduce the inductance. Two ground build-up vias 11g are arranged close to the ground core via 12g. Because of similar reasons, the inner layer ground pad 14g of the ground core via 12g and the inner layer ground pad 14g of the ground build-up via 11g are preferably circumscribed. In the first embodiment of the present invention shown in FIG. 2D, the power supply build-up via 11p or the ground build-up via 11g is arranged on the right side of the ground core via 12g or the power supply core via 12p. Alternatively, the power supply build-up via 11p or the ground build-up via 11g may be arranged on the left side of the ground core via 12g or the power supply core via 12p.

Figure 2E:
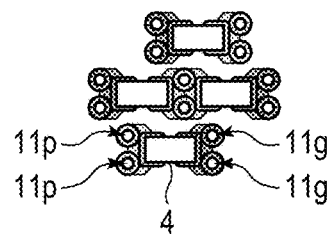

FIG. 2E is a plan view illustrating the wiring layer L8 of the printed wiring board 2. FIG. 2E illustrates an arrangement and connection relationship of the power supply build-up vias 11p, the ground build-up vias 11g, and the capacitor 4. Two power supply build-up vias 11p and one terminal of capacitor 4 are connected by a power supply wiring. Two ground build-up vias 11g and the other of the terminals of the capacitor 4 are connected by a ground wiring. In the first embodiment, the size of the capacitor in a plan view is 0.6 mm×0.3 mm.

Hereinafter, the reason why a power supply wiring of which occupied area is small and which has a small inductance can be realized in the printed circuit board 1 according to the first embodiment will be explained. First, the generation mechanism of power supply noise and SSN jitter will be explained. A switching current $I_{switching}$ occurs when the logic levels of the signals output from the signal terminals of the plurality of buffer circuits of the semiconductor device 3 are switched at the same time. A parasitic inductance $L_{parasitic}$ exists in the capacitor 4 and the printed wiring board 2 which are the power supply path 100 to the semiconductor device 3. When the switching current $I_{switching}$ flows in the parasitic inductance $L_{parasitic}$ a back electromotive force (power supply noise) $V_{noise}$ occurs. At this occasion, since the driving voltage of the buffer circuit fluctuates due to the power supply noise, the output timing of the signal from the buffer circuit fluctuates. In this manner, SSN jitter occurs.

Therefore, reducing power supply noise is effective for reducing the SSN jitter. The power supply noise $V_{noise}$ is given by Expression 1 below using the parasitic inductance $L_{parasitic}$ and the switching current $I_{switching}$.

$$V_{noise}(t) = L_{parasitic} \frac{dI_{switching}(t)}{dt} \quad \text{(Expression 1)}$$

In order to reduce power supply noise $V_{noise}$ with Expression 1, a method of reducing parasitic inductance $L_{parasitic}$, a method of decreasing switching current $I_{switching}$, or a method of doing both may be considered. However, in the method of reducing the switching current $I_{switching}$, it is necessary to reduce the consumption current of the circuit itself and reduce the number of simultaneous operations of the circuit, which results in limiting the performance of the circuit. Therefore, hereinafter explained is how to reduce the parasitic inductance $L_{parasitic}$ in order to reduce the power supply noise $V_{noise}$ while ensuring the high functionality and high performance of the electronic apparatus.

The parasitic inductance $L_{parasitic}$ of the printed wiring board 2 depends on the arrangement of the power supply via and the ground via. First, in order to find a part where the parasitic inductance $L_{parasitic}$ is high, the breakdown of the parasitic inductance of the power supply path 100 shown in FIG. 1 is analyzed. The layer configuration of the printed wiring board 2 is shown in Table 1 below. The thickness of the copper foil of each wiring layer is 30 μm, the thickness of the insulation layer of the build-up layer 21 is 65 μm, and the thickness of the insulation layer of the core layer 22 is 200 μm or 400 μm.

TABLE 1

| | | |
|---|---|---|
| Build-up layer | The thickness of the copper foil of the wiring layer L1 | 30 μm |
| | The thickness of the insulation layer between the wiring layer L1 and the wiring layer L2 | 65 μm |
| | The thickness of the copper foil of the wiring layer L2 | 30 μm |
| | The thickness of the insulation layer between the wiring layer L2 and the wiring layer L3 | 65 μm |
| Core layer | The thickness of the copper foil of the wiring layer L3 | 30 μm |
| | The thickness of the insulation layer between the wiring layer L3 and the wiring layer L4 | 200 μm |
| | The thickness of the copper foil of the wiring layer L4 | 30 μm |
| | The thickness of the insulation layer between the wiring layer L4 and the wiring layer L5 | 400 μm |
| | The thickness of the copper foil of the wiring layer L5 | 30 μm |
| | The thickness of the insulation layer between the wiring layer L5 and the wiring layer L6 | 200 μm |
| | The thickness of the copper foil of the wiring layer L6 | 30 μm |
| Build-up layer | The thickness of the insulation layer between the wiring layer L6 and the wiring layer L7 | 65 μm |
| | The thickness of the copper foil of the wiring layer L7 | 30 μm |

TABLE 1-continued

| | |
|---|---|
| The thickness of the insulation layer between the wiring layer L7 and the wiring layer L8 | 65 μm |
| The thickness of the copper foil of the wiring layer L8 | 30 μm |

The diameter $R_{build}$ of the power supply build-up via 11p and ground build-up via 11g is 0.15 mm (radius $r_{build}$ is 0.075 mm). The gap $a_{build}$ between the power supply build-up via 11p and the ground build-up via 11g is 0.5 mm. The diameter $R_{core}$ of the ground core via 12g of the power supply core via 12p is 0.3 mm (radius $r_{core}$ is 0.15 mm). The gap $a_{core}$ of the power supply core via 12p and the ground core via 12g is 1.0 mm.

Where the power supply via and the ground via are two parallel cylindrical lines, a self-inductance $L_{self}$ and a mutual inductance M can be calculated by Expression 2 and Expression 3 below.

$$L_{self} = \frac{\mu \times l}{2\pi} \left\{ \log\frac{l + \sqrt{l^2 + r^2}}{r} - \sqrt{1 + \left(\frac{r}{l}\right)^2} + \frac{r}{l} \right\} \quad \text{(Expression 2)}$$

$$M = \frac{\mu \times l}{2\pi} \left\{ \log\frac{l + \sqrt{l^2 + a^2}}{a} - \sqrt{1 + \left(\frac{a}{l}\right)^2} + \frac{a}{l} \right\} \quad \text{(Expression 3)}$$

In this case, μ is permeability (1.26×10$^{-6}$ H/m), and l is the length of the via.

The inductance $L_{total}$, which is the sum of the inductance of the power supply via and the ground via, is given by Expression 4 below using the self-inductance $L_{self}$ and the mutual inductance M.

$$L_{total} = \frac{(2L_{self} \pm 2M)}{N} \quad \text{(Expression 4)}$$

The mutual inductance M is different in sign depending on the direction of the current flowing through the two parallel cylindrical lines. When the current flows in the same direction, the mutual inductance M becomes positive, and when the current flows in the inverse direction, the mutual inductance M becomes negative. N is the number of vias (parallel number).

By using Expression 2, Expression 3, and Expression 4, the inductances of the vias of the build-up layer and the core layer were calculated. The inductance of the via of the build-up layer 21 is 64 pH. The inductance of the via of the core layer 22 is 372 pH. The parasitic inductance of the capacitor 4 is 200 pH when, for example, 0603 size capacitor manufactured by Murata Manufacturing Co., Ltd. (model number: GRM033R60J104KE19) is used.

Based on the above assumption, when the inductance of the via of the build-up layer 21, the inductance of the via of the core layer 22, and the parasitic inductance of the capacitor 4 are calculated, these ratios are 10%, 58% and 32%, respectively. As a result, the inductance of the via in the core layer 22 accounts for about 60% of the total inductance, indicating that reducing the via inductance of the core layer 22 is effective.

As a result of the above consideration, methods to reduce the inductance of the core layer 22 include a method of reducing the self-inductance and a method of reducing the total inductance by making use of the mutual inductance (making the mutual inductance negative). In order to reduce the self-inductance, according to Expression 2 and Expression 4, it may be possible to shorten the length of the via, increase the diameter of the via, lower the magnetic permeability, increase the number of parallel vias. In order to make use of the mutual inductance, it may be possible to increase the length of two vias through which current flows in the inverse direction, narrow the gap of the vias in which the current flows in the inverse direction, widen the gap of the vias in which the current flows in the same direction, and increase the magnetic permeability.

Figure 3:
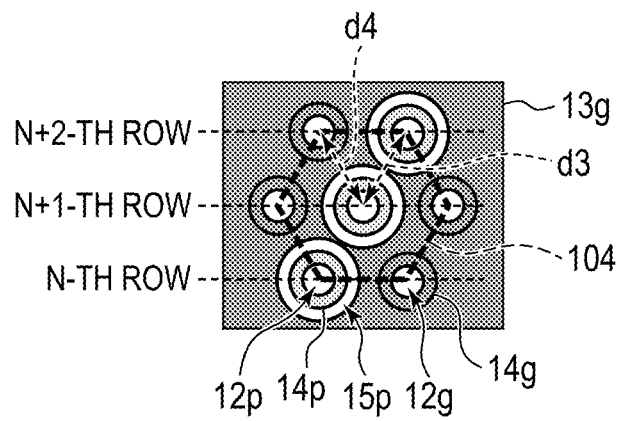
FIG. 3 is a plan view illustrating a ground layer according to a modification of the first embodiment.

Therefore, in the methods for reducing the inductance of the vias, the way to reduce inductance by arranging the via is focused on and considered. FIG. 3 is a plan view illustrating the ground layer (wiring layer L4) according to a modification of the first embodiment, and illustrates the arrangement of the ground layer for reducing the self-inductance. As shown in FIG. 3, for the purpose of reducing the inductance by increasing the number of vias arranged in parallel, the vias are arranged at the center and the vertexes of a regular hexagon 104.

The arrangement of the power supply core vias 12p and the ground core vias 12g will be explained in detail with reference to FIG. 3. In the n-th row, from the left-hand side, the power supply core via 12p and the ground core via 12g are arranged in order at the vertexes of the regular hexagon 104. In the (n+1)-th row, from the left-hand side the ground core via 12g, the power supply core via 12p, and the ground core via 12g are arranged in order. In this case, the two ground core vias 12g are arranged at the vertexes of the regular hexagon 104, and the power supply core via 12p is arranged in the center of the regular hexagon 104. In the (n+2)-th row, from the left-hand side, the ground core via 12g and the power supply core via 12p are arranged at the vertexes of the regular hexagon 104.

In other words, the regular hexagon 104 has arrangement including, as units, an equilateral triangle having two ground core vias 12g and one power supply core via 12p as vertexes and an equilateral triangle having one ground core via 12g and two power supply core vias 12p as vertexes. Therefore, the gap between adjacent power supply core vias 12p, the gap between adjacent ground core vias 12g, and the gap between a power supply core vias 12p and a ground core via 12g adjacent to each other are all equal.

In this case, in order to improve the arrangement density of vias, the inner layer power supply clearance 15p of the power supply core via 12p in the n-th row and the inner layer power supply clearance 15p of the power supply core via 12p in the (n+1)-th row are circumscribed. By arranging the regular hexagon 104 like this, the arrangement density of core vias can be improved and the number of core vias in parallel can be increased. As shown in Expression 4, the self-inductance can be reduced by increasing the number of core vias in parallel.

However, in the configuration of the present modification, the power supply core vias 12p (the core vias of the same electric potential) are arranged close to each other, and therefore, it is found that a positive mutual inductance may occur and the reduction of inductance may be insufficient. Therefore, in the present embodiment, in order to utilize the mutual inductance, an arrangement is adopted in which the gap of the core vias of the same potential is widened and the core vias of different potentials are brought close to each other.

Figure 4:
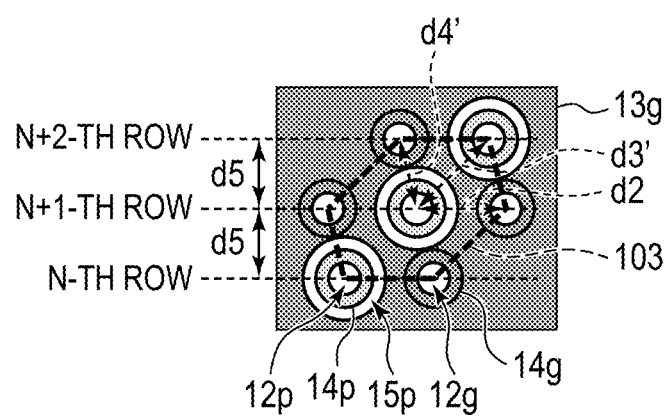
FIG. 4 is a plan view illustrating a ground layer according to the first embodiment.

FIG. 4 is a plan view of the ground layer (wiring layer L4) according to the present embodiment, and illustrates an arrangement of the ground layer for reducing the inductance by further using the mutual inductance in addition to the modification of FIG. 3. Since it is similar to that shown in FIG. 2C, a detailed explanation will not be given here. In this case, the effect of reduction of the inductance by arrangement of the core vias will be explained by comparing the inductances calculated using Expression 2, Expression 3, and Expression 4.

In the arrangement according to the modification of FIG. 3, the length of one side of the regular hexagon 104 is 1.0 mm. The diameter of the external peripheral side of the inner layer power supply clearance 15$p$ is 1.0 mm, and the diameter of the inner layer ground pad 14$g$ is 0.4 mm. The center-to-center distance d3 of the power supply core via 12$p$ is 1.0 mm. The center-to-center distance d4 of the power supply core via 12$p$ and the ground core via 12$g$ is also 1.0 mm. Furthermore, the diameter of the via is 0.3 mm and the length of the via is 0.8 mm. Under this condition, the inductance occurring in via of the core layer 22 is 125 pH.

In contrast, in the arrangement according to the present embodiment shown in FIG. 4, the center-to-center distance d3' of the power supply core via is about 1.2 mm. The center-to-center distance d4' between the power supply core via and the ground core via is about 0.9 mm. Under this condition, the inductance occurring in via of the core layer 22 is 94 pH. Therefore, the inductance occurring in the via of the core layer 22 is reduced more greatly than the arrangement according to the modification of FIG. 3.

In the modification, the distance between the power supply core vias 12$p$ is 1.0 mm, whereas in the present embodiment, the distance is about 1.2 mm. Therefore, the positive mutual inductance between the power supply core vias 12$p$ is reduced. Likewise, in the present embodiment, the distance between the ground core vias 12$g$ is also wider, and the positive mutual inductance between the ground core vias 12$g$ is also reduced. In the modification, the distance between the power supply core via 12$p$ and the ground core via 12$g$ is 1.0 mm, whereas in the present embodiment, the distance is about 0.9 mm. Therefore, the negative mutual inductance between the power supply core via 12$p$ and the ground core via 12$g$ becomes large. Therefore, according to the present embodiment, the mutual inductance increases in the negative direction, thereby reducing the total inductance. In addition, the arrangement of the vias in the parallel hexagon 103 has an area efficiency that is equal to or nearly equal to that of the regular hexagon 104, so the arrangement of the vias in the parallel hexagon 103 can sufficiently reduce the occupied area.

As described above, the present embodiment is designed to achieve not only the same area efficiency as the core via arrangement in the regular hexagon but also the reduction of the inductance by widening the gap of the core vias of the same potential and bringing the core vias of different potentials close to each other. In order to allow these restrictions to be held at the same time, in the present embodiment, as shown in FIG. 2C and FIG. 4, a scalene triangle having the largest gap of the core vias of the same potential has a core via arranged in the triangular lattice form which is the smallest unit of arrangement. In the present embodiment, by placing the core via in the form of the parallel hexagon with units of 6 scalene triangles, the area efficiency equal to or nearly equal to that of the regular hexagon 104 can be obtained. Just like the regular hexagon, the parallel hexagon is a figure that can be densely laid in a plane without gaps.

Therefore, according to the present embodiment, a printed wiring board and a printed circuit board having a power supply wiring structure of which occupied area is small and which has a small inductance can be provided.

Here, the dimension for establishing the via arrangement shown in FIG. 4 will be considered. Let r1 be the radius of the circular shape of the external peripheral side of the inner layer power supply clearance 15$p$. Let r2 be the radius of the circular shape of the external peripheral side of the inner layer power supply pad 14$p$. At this occasion, the radius r1 of the external peripheral side of the inner layer power supply clearance 15$p$ is larger than the radius r2 of the external peripheral side of the inner layer power supply pad 14$p$, and therefore r1>r2 holds. Where the center-to-center distance of the core vias which are arranged in the horizontal direction is denoted as d2, an expression d2>r1+r2 holds, because of the constraint that the inner layer power supply clearance 15$p$ and the inner layer ground pad 14$g$ should not interfere. Let d5 be the gap in each row (in FIG. 4, the gap between the n-th row and the (n+1)-th row, and the gap between the (n+1)-th row and the (n+2)-th row). The condition for allowing the inner layer ground pad 14$g$ in the n-th row and the inner layer power supply clearance 15$p$ in the (n+1)-th to be circumscribed is d5<r1+r2.

Second Embodiment

Subsequently, in the second embodiment of the present invention, the power supply structure of the printed wiring board 2$a$ in which the power supply core vias 12$p$ and the ground core vias 12$g$ constituting the parallel hexagon 103 shown in the first embodiment are repeatedly arranged in the plane direction will be explained. In each figure, only three cycles of the repetitive arrangement are shown, but the number of cycles can be changed.

Figure 5:
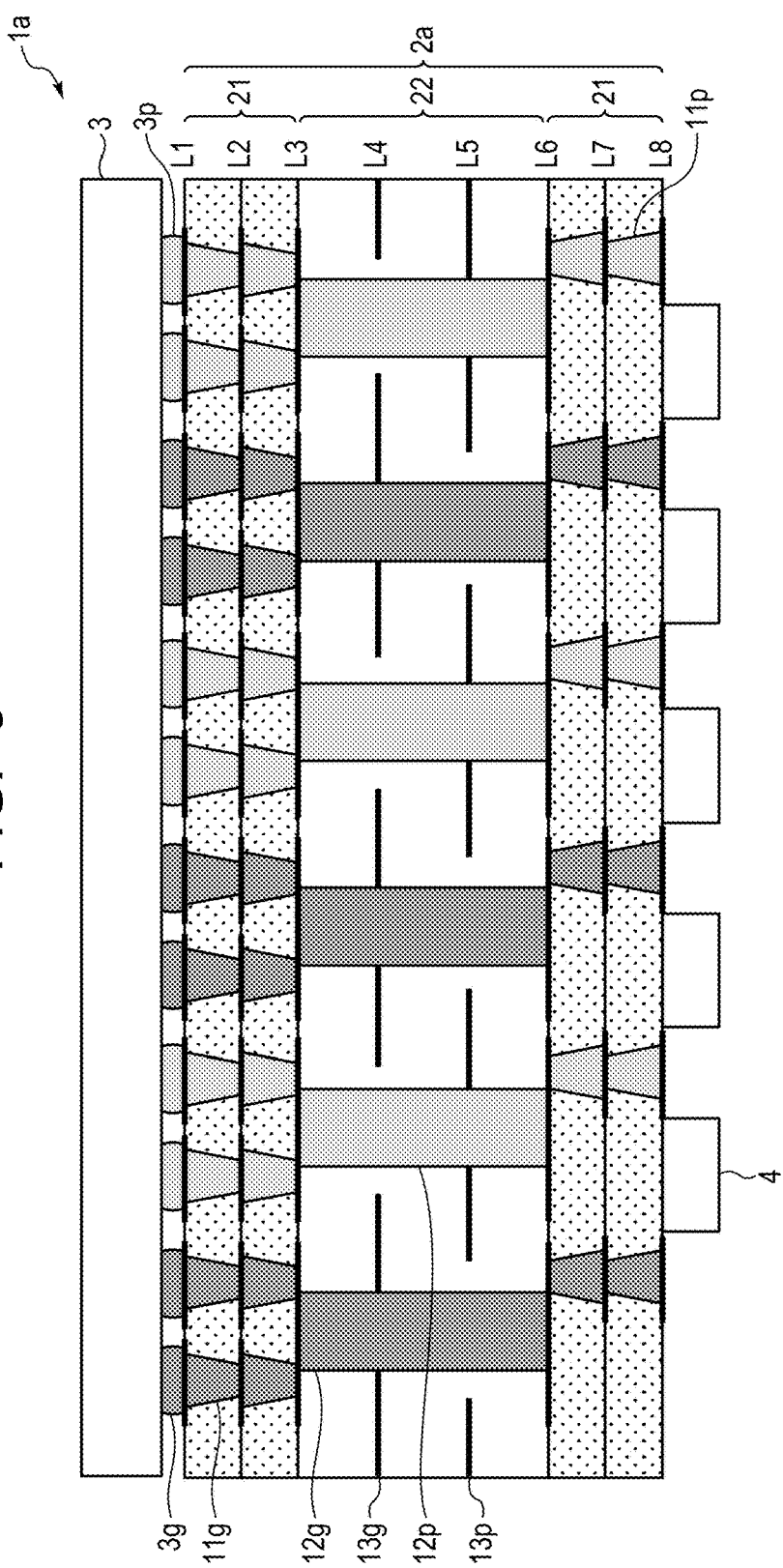
FIG. 5 is a cross-sectional view illustrating a printed circuit board according to a second embodiment.

FIG. 5 is a sectional view illustrating a printed circuit board 1$a$ according to the second embodiment. As shown in FIG. 5, the printed circuit board 1$a$ has a printed wiring board 2$a$, a semiconductor device 3, and a plurality of capacitors 4 which are bypass devices. The configuration of FIG. 5 is similar to that of FIG. 1 except that the structures of the vias shown in FIG. 1 are repeatedly arranged. Therefore, a detailed description thereabout is omitted.

Figure 6A:
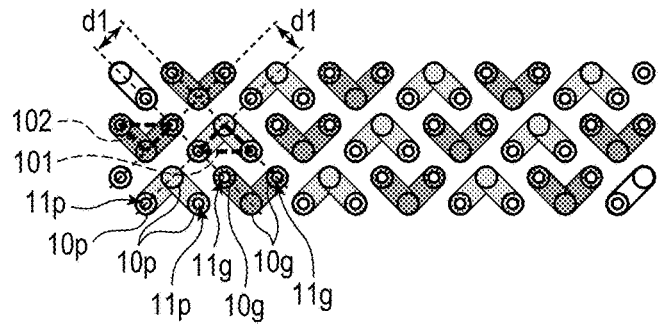
FIG. 6A, FIG. 6B, FIG. 6C, FIG. 6D, and FIG. 6E are plan views illustrating a wiring layer constituting the printed wiring board according to the second embodiment.
Figure 6B:
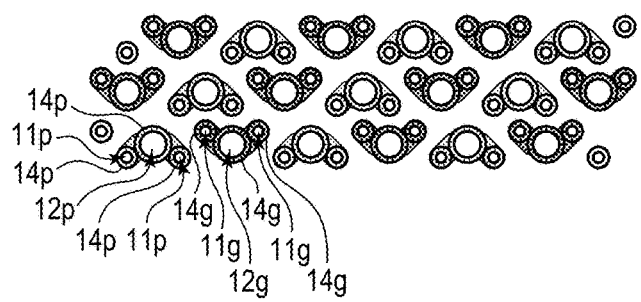

FIG. 6A to FIG. 6E are plan views illustrating the wiring layers constituting the printed wiring board 2$a$ according to the second embodiment. FIG. 6A is a plan view illustrating the wiring layer L1 of the printed wiring board 2$a$. FIG. 6B is a plan view illustrating the wiring layer L3 of the printed wiring board 2$a$. FIG. 6A and FIG. 6B are similar to FIG. 2A and FIG. 2B except that the structures of vias shown in FIG. 2A and FIG. 2B are repeatedly arranged. Therefore, a detailed description thereabout is omitted.

Figure 6C:
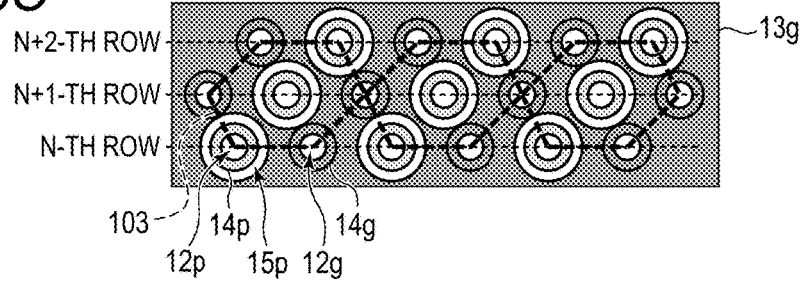

FIG. 6C is the plan view of the wiring layer L4 of the printed wiring board 2$a$, i.e., the ground layer. The core vias in the parallel hexagon according to the first embodiment are repeatedly arranged in the plane direction. The repeat sequences will be described in more details with reference to FIG. 6C. The arrangements of the power supply core vias 12$p$ and the ground core vias 12$g$ constituting the parallel hexagon 103 shown in FIG. 6C are referred to as a first lattice, a second lattice, a third lattice, . . . , from the left-hand side. The core vias are arranged so that the ground core via 12$g$ located at the right-hand side in the (n+1)-th row of the first lattice and the ground core via 12$g$ located at the left-hand side in the (n+1)-th row of the second lattice adjacent to the first lattice are common. Likewise, the core vias are arranged so that the ground core via 12g located at the right-hand side in the (n+1)-th row of the second lattice and the ground core via 12g located at the left-hand side in the (n+1)-th row of the third lattice adjacent to the second lattice are common. As described above, the core vias are repeatedly arranged with seven core vias constituting the parallel hexagon 103 being a unit, and a common core via is arranged at the vertexes of two adjacent parallel hexagons.

At this occasion, the power supply core via 12p in the n-th row of the second lattice is arranged close to the ground core via 12g located at the right-hand side in the (n+1)-th row of the first lattice. The core vias at different potentials of the first lattice and the second lattice are in proximity, which generates a negative mutual inductance, whereby the inductance is reduced. Likewise, the core vias at different potentials also are in proximity in the second lattice and the third lattice, which generates a negative mutual inductance, whereby the inductance is reduced.

Figure 6D:
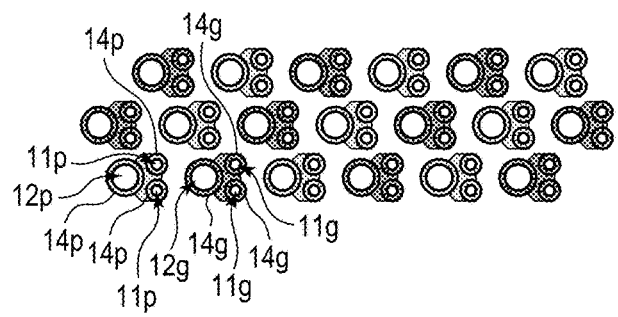

FIG. 6D is the plan view illustrating the wiring layer L6 of the printed wiring board 2a. FIG. 6D has a similar structure except that the structure of the vias shown in FIG. 2D are repeatedly arranged. Therefore, a detailed explanation thereabout will be omitted.

Figure 6E:
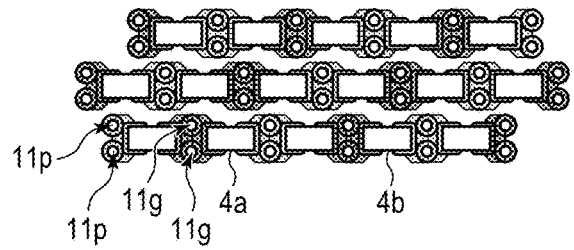

FIG. 6E is a plan view of the wiring layer L8 of the printed wiring board 2a. With regard to the arrangement of the bypass capacitor, features different from the first embodiment will be described. A capacitor 4a is arranged between the ground core via 12g in the n-th row of the first lattice and the power supply core via 12p in the n-th row of the second lattice. Likewise, a capacitor 4b is arranged between the ground core via 12g in the n-th row of the second lattice and the power supply core via 12p in the n-th row of the third lattice. As described above, the capacitors 4a and 4b can be arranged so as to connect the bypass capacitors between core vias of different lattices. As a result, the parasitic inductance of the bypass capacitor can be reduced by the effect of the parallel connection.

Figure 7:
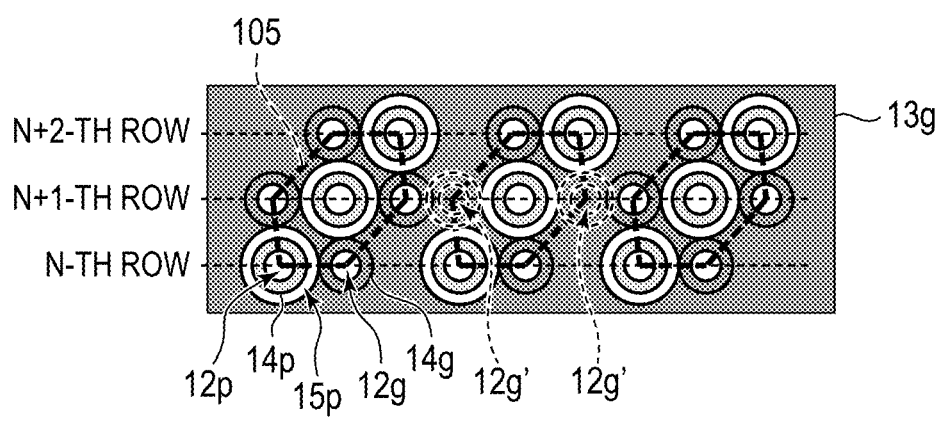
FIG. 7 is a plan view illustrating a ground layer according to a modification of the second embodiment.

FIG. 7 is a plan view of the wiring layer L4 according to a modification of the second embodiment. In the present modification, as shown in FIG. 7, in order to make use of the mutual inductance between core vias of different potentials, four ground core vias 12g were arranged close to the power supply core via 12p in the center of the parallel hexagon 105. In this configuration, seven core vias constituting the parallel hexagon 105 form six isosceles triangles. However, in the present modification, the ground core via 12g located at the right-hand side in the (n+1)-th row of the first lattice and the ground core via 12g' that should be located at the left-hand side in the (n+1)-th row of the second lattice interfere with each other. Similarly, the ground core via 12g' that should be located at the right-hand side in the (n+1)-th row of the second lattice and the ground core via 12g located at the left-hand side in the (n+1)-th row of the third lattice interfere with each other. Therefore, the ground core via 12g' of the second lattice cannot be arranged in some cases. In this case, the amount of negative mutual inductance generated corresponding to the power supply core via 12p of the second lattice decreases. Therefore, in the repeated sequence according to the present modification, the inductance of the power supply core via 12p of the second lattice may become large.

When the inductance caused by the arrangement of the core via shown in FIG. 6A to FIG. 6E is calculated using the same conditions as those described in the first embodiment, it is 31.3 pH. On the other hand, when the arrangement of the core vias are replaced with that shown in FIG. 7, the inductance is 32.6 pH. Therefore, although the reduction in the inductance can be realized to some extent by the structure according to the modification, the configuration shown in FIG. 6A to FIG. 6E according to the second embodiment can more effectively reduce the inductance.

Third Embodiment

Subsequently, in the third embodiment of the present invention, a method of arranging the corner portion when the power supply core vias 12p and the ground core vias 12g are repeatedly arranged in the plane direction will be explained. Since the third embodiment of the present invention is the same as the second embodiment except for the vicinity of the corner portion, repeated explanation may be omitted. For example, the sectional structure of the printed wiring board 2a is the same as that of the second embodiment. Therefore, illustration and description thereabout are omitted. In each figure, only four cycles of the repetitive arrangement are shown, but the number of cycles can be changed.

Figure 8A:
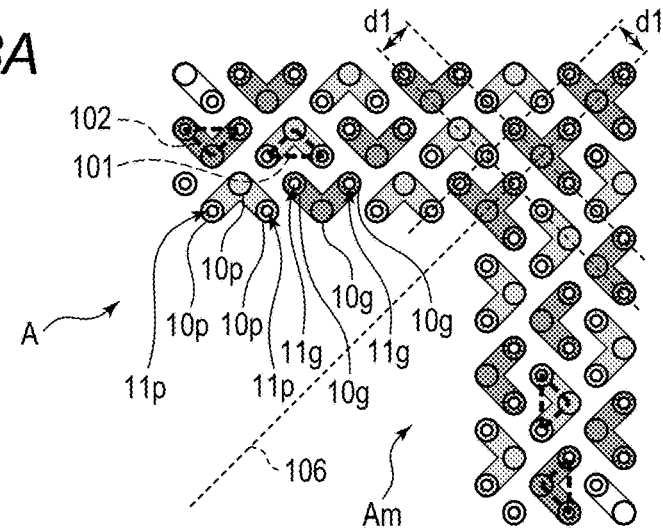
FIG. 8A, FIG. 8B, and FIG. 8C are plan views illustrating a printed wiring board according to a third embodiment.

FIG. 8A is a plan view of the wiring layer L1 of the printed wiring board 2a. The surface layer power supply pad 10p, the surface layer ground pad 10g, and the like are arranged line-symmetrically with respect to the straight line 106. More specifically, in the area A on the upper left side of the straight line 106, the surface layer power supply pad 10p, the surface layer ground pad 10g, and the like have the same arrangement as those of the second embodiment. On the contrary, in the area Am on the lower right side of the straight line 106, the surface layer power supply pad 10p, the surface layer ground pad 10g, and the like are arranged so that the area A is inverted to be line symmetrical with respect to the straight line 106.

Figure 8B:
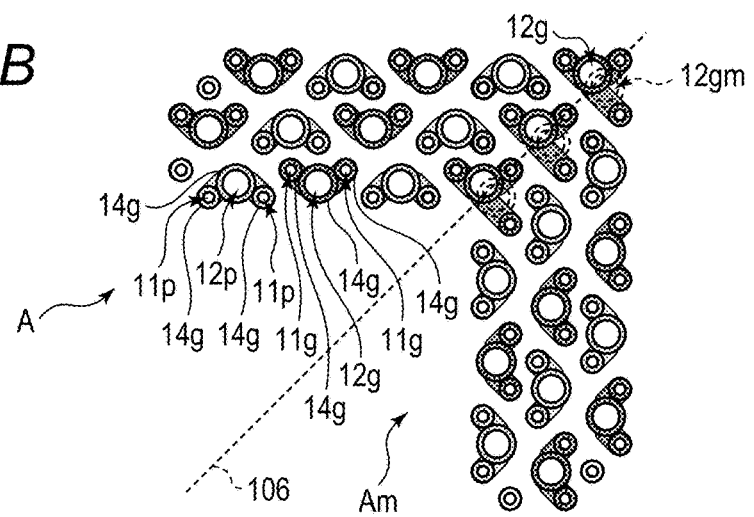

FIG. 8B is a plan view of the wiring layer L3 of the printed wiring board 2a. The wiring layer L3 is also made up of an area A having the same arrangement as that of the second embodiment and an area Am which is substantially line symmetrical therewith. However, when the ground core vias on the straight line 106 are inverted, i.e., when the ground core vias 12g in the corner portion are inverted, the inverted ground core vias 12gm are at the position indicated by the broken lines in the figure, and the core vias come into contact with each other. To avoid this, the ground core vias 12gm are not arranged, and exceptionally, the ground core vias in the corner portion are not symmetrical with respect to the straight line 106.

Figure 8C:
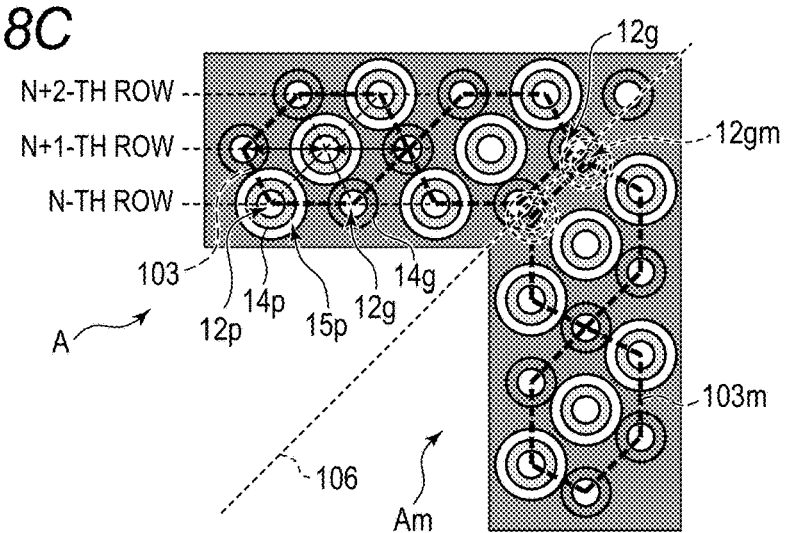

FIG. 8C is a plan view of the wiring layer L4 of the printed wiring board 2a. The wiring layer L4 is also made up of an area A having the same arrangement as that of the second embodiment and an area Am which is substantially line symmetrical with therewith. However, as mentioned above, in order to avoid contact between the core vias, the ground core via 12gm is not arranged, and exceptionally, the ground core vias in the corner portion are not symmetrical with respect to the straight line 106. At this time, in the parallel hexagon 103m symmetrical to the parallel hexagon 103 with respect to the straight line 106, the unarranged ground core via 12gm in the corner portion is a vertex. In this way, in the vicinity of the corner portion, in the case where the core vias cannot be arranged when inverted with respect to the straight line 106, a configuration may be adopted in which the via is not arranged at some of the vertexes or the center of the parallel hexagon 103m.

Figure 9A:
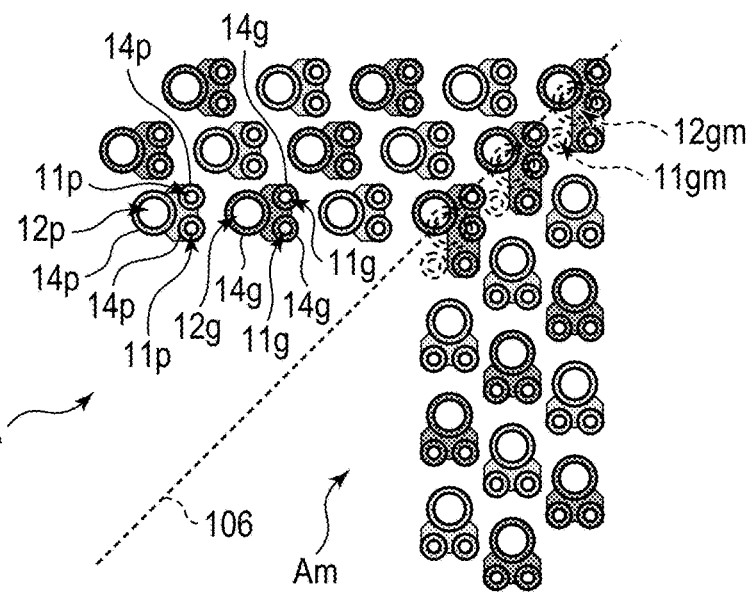
FIG. 9A and FIG. 9B are plan views illustrating a printed wiring board according to the third embodiment.

FIG. 9A is a plan view of the wiring layer L6 of the printed wiring board 2a. In the wiring layer L6, the area A on the upper left side of the straight line 106 is arranged in the same manner as that of the second embodiment. The arrangement of the area A rotated clockwise by 90 degrees is arranged in the area Am on the lower right side of the straight line 106. However, in the corner portion, after the rotation, the ground build-up via 11gm and the ground core via 12gm are at the positions indicated by the broken lines in the figure, and the vias come into contact with each other. In order to avoid this, the ground build-up via 11gm and the ground core via 12gm are not arranged, and exceptionally, the vias in the corner portion are not a repetitive arrangement at the part extending over the straight line 106.

Figure 9B:
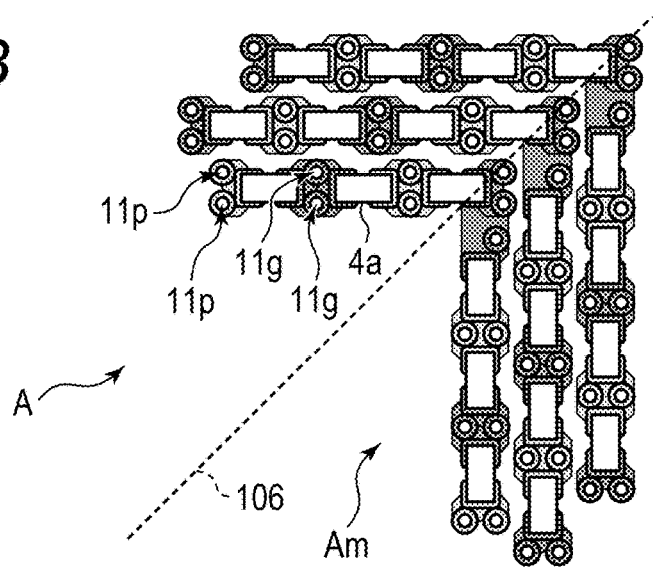

FIG. 9B is a plan view of the wiring layer L8 of the printed wiring board 2a. FIG. 9B is similar to that of the second embodiment except that the positions of the ground build-up via 11g and the power supply build-up via 11p correspond to those shown in FIG. 9A. Therefore, explanation thereabout is omitted.

As described above, in the third embodiment, the case having the corner portion in which the direction arranged in the repetitive arrangement described in the second embodiment changes so as to bend has been explained. In the vicinity of the corner portion, the contact of the vias are avoided by discontinuous repetitive arrangement. Therefore, in the present embodiment having the corner portion, as shown in FIG. 8C, the repetitive arrangement of the parallel hexagons 103 and 103m is possible. Therefore, the same effects as those of the first embodiment and the second embodiment can be obtained.

Fourth Embodiment

Figure 10:
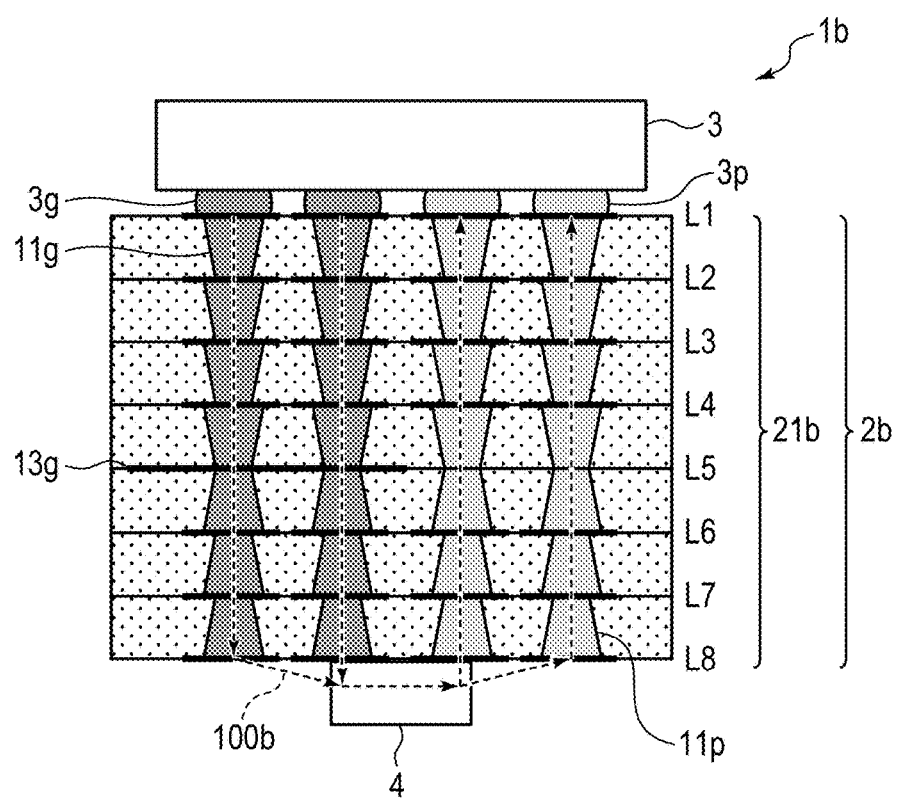
FIG. 10 is a cross sectional view illustrating a printed circuit board according to a fourth embodiment.

FIG. 10 is a cross-sectional view of a printed circuit board 1b according to the fourth embodiment. As shown in FIG. 10, the printed circuit board 1b has a printed wiring board 2b, a semiconductor device 3, and a capacitor 4. Unlike the printed wiring board 2 according to the first embodiment shown in FIG. 1 or the printed wiring board 2a according to the second and third embodiments shown in FIG. 5, the printed wiring board 2b according to the fourth embodiment is such that all the layers are built-up layers 21b. In other words, the printed wiring board 2b according to the fourth embodiment has a structure without the core layer 22.

The ground build-up via 11g and the power supply build-up via 11p of the printed wiring board 2b have the structure of the pad-on via. The power supply terminal 3p of the semiconductor device 3 is connected to one of the terminals of the capacitor 4 through the power supply build-up via 11p of the printed wiring board 2b. The ground terminal 3g of the semiconductor device 3 is connected to the other of the terminals of the capacitor 4 via the ground build-up via 11g of the printed wiring board 2b. A current is supplied to the semiconductor device 3 via the power supply path 100b. Since other configurations in the sectional view are substantially the same as those in the above-described embodiment, description thereof will be omitted.

Figure 11A:
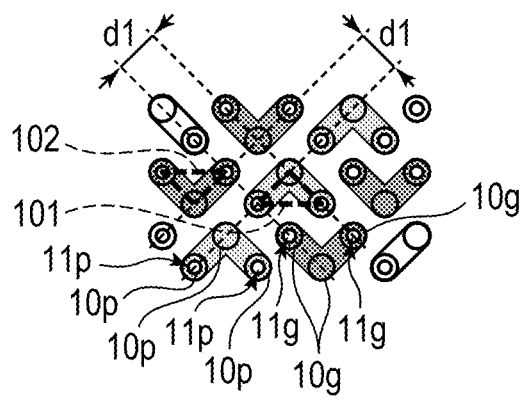
FIG. 11A, FIG. 11B, and FIG. 11C are plan views illustrating a printed wiring board according to the fourth embodiment.
Figure 11B:
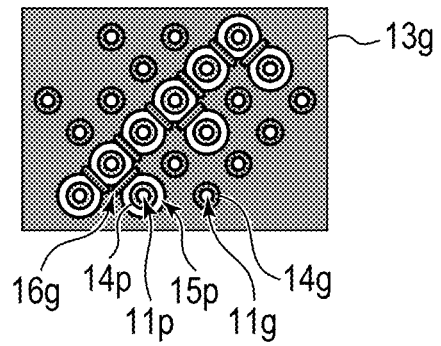
Figure 11C:
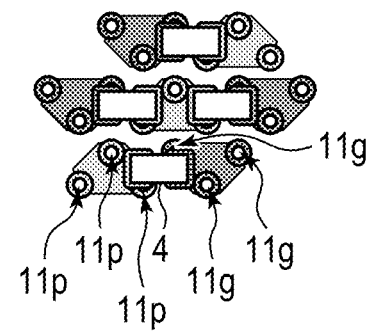

FIG. 11A to FIG. 11C are the plan views of the wiring layer constituting the printed wiring board 2b according to the fourth embodiment. FIG. 11A is a plan view of the wiring layer L1 of the printed wiring board 2b. Since it is the same as FIG. 2A of the first embodiment, explanation thereabout will be omitted.

FIG. 11B is a plan view of the inner layer (for example, the wiring layer L5 in FIG. 10, i.e., the ground layer) of the printed wiring board 2b. The diameter of the inner layer power supply pad 14p and the inner layer ground pad 14g is 0.3 mm. The width of the inner layer power supply clearance 15p, i.e., the gap between the inner layer power supply pad 14p and the ground plane 13g is 0.1 mm. In this arrangement, the ground plane 13g may be divided because the inner layer power supply clearances 15p are circumscribed by each other. Therefore, in order to reduce occurrence of this division, a reinforcing portion 16g having a thick ground plane 13g is provided between the inner layer power supply clearances 15p.

FIG. 11C is a plan view of the wiring layer L8 of the printed wiring board 2b. FIG. 11C illustrates the arrangement and connection relationship of the power supply build-up via 11p, the ground build-up via 11g, and the capacitor 4. Three power supply build-up vias 11p and one terminal of the capacitor 4 are connected by a power supply wiring. Three ground build-up vias 11g and the other of the terminals of the capacitor 4 are connected by a ground wiring.

In order to reduce the development cost of the semiconductor device, one design of the semiconductor device may be shared by different electronic apparatuses. However, since the function or the performance differs for each electronic apparatus, the printed wiring board on which the semiconductor device 3 is mounted may be different for each product. For example, in a multifunctional electronic apparatus, a printed wiring board in which all the layers are build-up layers is used since a lot of signal wirings are required. On the other hand, in order to reduce the cost of the printed wiring board, a printed wiring board with build-up layers stacked on the core layer is sometimes used in a low-priced electronic apparatus with limited functions. In order to allow a semiconductor device to be shared by a multi-functional electronic apparatus and an inexpensive electronic apparatus, the positions of the power supply terminals and the ground terminals are required to be common between the multifunction version and the inexpensive version.

The printed wiring board 2b according to the fourth embodiment uses build-up layers for all the layers. On the other hand, the printed wiring board 2 according to the first embodiment and the printed wiring board 2a according to the second embodiment and the third embodiment have a structure obtained by stacking the build-up layer 21 on the core layer 22. As described above, the arrangements of the wiring layers L1 of them both are the same. Therefore, when the printed wiring board according to the first to third embodiments is used for the inexpensive electronic apparatus and the printed wiring board 2b according to the fourth embodiment is used for the multi-function electronic apparatus, the terminal arrangement of the semiconductor device 3 can be made common. Therefore, the development cost of the semiconductor device can be reduced by using the printed wiring board according to the first to fourth embodiments for the electronic apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-241103, filed Dec. 13, 2016, which is hereby incorporated by reference herein in its entirety.

What is claimed is:

1. A printed wiring board comprising:
   a plurality of inner layers including a ground layer and a power supply layer; and
   a plurality of ground vias and a plurality of power supply vias each provided to penetrate at least the ground layer and the power supply layer in a thickness direction of the printed wiring board, a ground potential being applied to the plurality of ground vias at the ground layer, and a power supply potential being applied to the plurality of power supply vias at the power supply layer, wherein, in a top view from a direction perpendicular to the printed wiring board, a distance between vias to which the same potential is applied is longer than a distance between vias to which different potentials are applied, the plurality of ground vias and the plurality of power supply vias form a triangular lattice including, as a unit, a first scalene triangle in which two ground vias and one power supply via are arranged at vertexes thereof and a second scalene triangle in which one ground via and two power supply vias are arranged at vertexes thereof, the ground via is arranged at vertexes at both ends of the longest side of the first scalene triangle, and the power supply via is arranged at vertexes at both ends of the longest side of the second scalene triangle.

2. The printed wiring board according to claim 1, wherein the first scalene triangle and the second scalene triangle are congruent.

3. The printed wiring board according to claim 1, wherein in a top view from a direction perpendicular to the printed wiring board, the plurality of ground vias and the plurality of power supply vias form a parallel hexagon including two first scalene triangles and four second scalene triangles as a unit, and the parallel hexagon includes, as vertexes, four ground vias and two power supply vias, and includes one power supply via.

4. The printed wiring board according to claim 3, wherein in a top view from a direction perpendicular to the printed wiring board, the plurality of ground vias and the plurality of power supply vias form a repetitive arrangement in which vias form the parallel hexagon as a unit, and in the repetitive arrangement, a common via is arranged at vertexes at two adjacent parallel hexagons.

5. The printed wiring board according to claim 4, wherein the repetitive arrangement has a corner portion in which a direction for arranging the plurality of ground vias and the plurality of power supply vias changes, and in a vicinity of the corner portion, the vias of the repetitive arrangement have discontinuous arrangement.

6. The printed wiring board according to claim 1, wherein the printed wiring board includes a core layer and a build-up layer, and any of the ground layer and the power supply layer is formed in the core layer.

7. A printed circuit board comprising:

the printed wiring board according to claim 1; and a semiconductor device which has a ground terminal electrically connected to the ground layer of the printed wiring board and a power supply terminal electrically connected to the power supply layer of the printed wiring board, and which is mounted on a first mounting surface of the printed wiring board.

8. The printed circuit board according to claim 7, further comprising:

a bypass device which has a first terminal electrically connected to the ground layer of the printed wiring board and a second terminal electrically connected to the power supply layer of the printed wiring board, and which is mounted on a second mounting surface different from the first mounting surface of the printed wiring board.

9. An electronic apparatus comprising:

a printed wiring board including:

a plurality of inner layers including a ground layer and a power supply layer; and a plurality of ground vias and a plurality of power supply vias each provided to penetrate at least the ground layer and the power supply layer in a thickness direction of the printed wiring board, a ground potential being applied to the plurality of ground vias at the ground layer, and a power supply potential being applied to the plurality of power supply vias at the power supply layer, wherein, in a top view from a direction perpendicular to the printed wiring board, a distance between vias to which the same potential is applied is longer than a distance between vias to which different potentials are applied, the plurality of ground vias and the plurality of power supply vias form a triangular lattice including, as a unit, a first scalene triangle in which two ground vias and one power supply via are arranged at vertexes thereof and a second scalene triangle in which one ground via and two power supply vias are arranged at vertexes thereof, the ground via is arranged at vertexes at both ends of the longest side of the first scalene triangle, and the power supply via is arranged at vertexes at both ends of the longest side of the second scalene triangle; and a semiconductor device which has a ground terminal electrically connected to the ground layer of the printed wiring board and a power supply terminal electrically connected to the power supply layer of the printed wiring board, and which is mounted on a first mounting surface of the printed wiring board.

10. The electronic apparatus according to claim 9, wherein in a top view from a direction perpendicular to the printed wiring board, the plurality of ground vias and the plurality of power supply vias form a parallel hexagon including two first scalene triangles and four second scalene triangles as a unit, and the parallel hexagon includes, as vertexes, four ground vias and two power supply vias, and includes one power supply via.

11. The electronic apparatus according to claim 10, wherein in a top view from a direction perpendicular to the printed wiring board, the plurality of ground vias and the plurality of power supply vias form a repetitive arrangement in which vias form the parallel hexagon as a unit, and in the repetitive arrangement, a common via is arranged at vertexes at two adjacent parallel hexagons.

12. The electronic apparatus according to claim 11, wherein the repetitive arrangement has a corner portion in which a direction for arranging the plurality of ground vias and the plurality of power supply vias changes, and in a vicinity of the corner portion, the vias of the repetitive arrangement have discontinuous arrangement.

13. The electronic apparatus according to claim 9, wherein the printed wiring board includes a core layer and a build-up layer, and any of the ground layer and the power supply layer is formed in the core layer.

* * * * *